United States Patent [19]

Solhjell et al.

[11] Patent Number: 4,780,888
[45] Date of Patent: Oct. 25, 1988

[54] METHOD AND ARRANGEMENT FOR DISTURBANCE-PROOF RECOGNITION OF DATA CONTAINED IN DATA SIGNALS

[75] Inventors: Erik Solhjell, Oslo; Steinar Strand, Langhus, both of Norway

[73] Assignee: Tandberg Data A/S, Oslo, Norway

[21] Appl. No.: 908,610

[22] Filed: Sep. 18, 1986

[30] Foreign Application Priority Data

Sep. 19, 1985 [DE] Fed. Rep. of Germany ....... 3533467

[51] Int. Cl.[4] .......................... H04B 1/10; H03K 5/00; H04L 7/02
[52] U.S. Cl. ..................... 375/103; 328/127; 328/164; 360/51; 375/4; 375/102; 375/104; 375/108; 375/110
[58] Field of Search ............... 328/120, 127, 149, 164; 375/4, 102–104, 108, 110; 360/51

[56] References Cited

U.S. PATENT DOCUMENTS

| | | | |
|---|---|---|---|
| 3,391,344 | 7/1968 | Goldberg | 375/104 X |
| 3,447,086 | 5/1969 | Sukehiro et al. | 375/4 |
| 3,588,718 | 6/1971 | Oiso | 375/103 X |
| 3,626,298 | 12/1971 | Paine et al. | 375/110 |
| 3,789,303 | 1/1974 | Hoffman et al. | 375/110 |
| 3,878,381 | 4/1975 | Broder et al. | 364/728 |
| 4,010,421 | 3/1977 | Lind | 375/110 X |
| 4,088,832 | 5/1978 | Eastmond | 375/110 |
| 4,157,576 | 6/1979 | Hack et al. | 360/77 |
| 4,311,963 | 1/1982 | Watanabe et al. | 375/104 X |
| 4,599,657 | 7/1986 | Kinoshita et al. | 358/213.3 X |
| 4,626,788 | 12/1986 | Ishigaki | 328/149 X |

FOREIGN PATENT DOCUMENTS 1294438  5/1969  Fed. Rep. of Germany.
2535304  2/1977  Fed. Rep. of Germany.

Primary Examiner—Stephen C. Buczinski
Assistant Examiner—Linda J. Wallace
Attorney, Agent, or Firm—Hill, Van Santen, Steadman & Simpson

[57] ABSTRACT

Timing signals are generated in a prescribed time duration after signal edges of data signals. Integrated data signals, rather than the data signals themselves, are sampled with these timing signals. First, data contained in the data signals is recovered from the sampling signals generated by the sampling. Noise signals are eliminated by integration of the data signals, and the data is recovered with greater protection against disturbance. The integration can occur with analog or digital components, and it is possible to provide the sampling of the data signals in addition to the sampling of the integrated data signals in order, when warranted, to recover the data from the data signals, or from the integrated data signals, dependent on the respective disturbances.

13 Claims, 4 Drawing Sheets

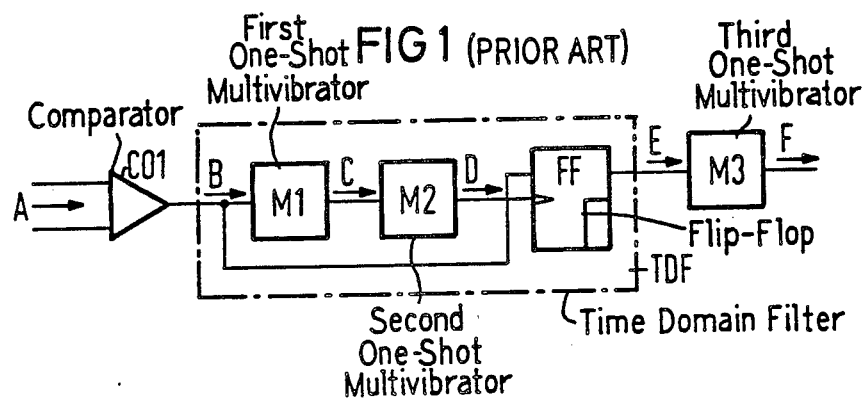
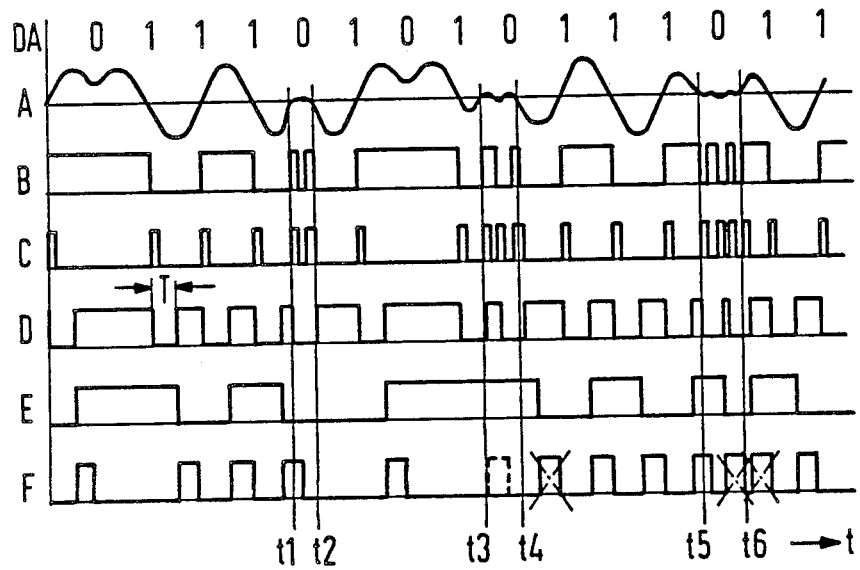

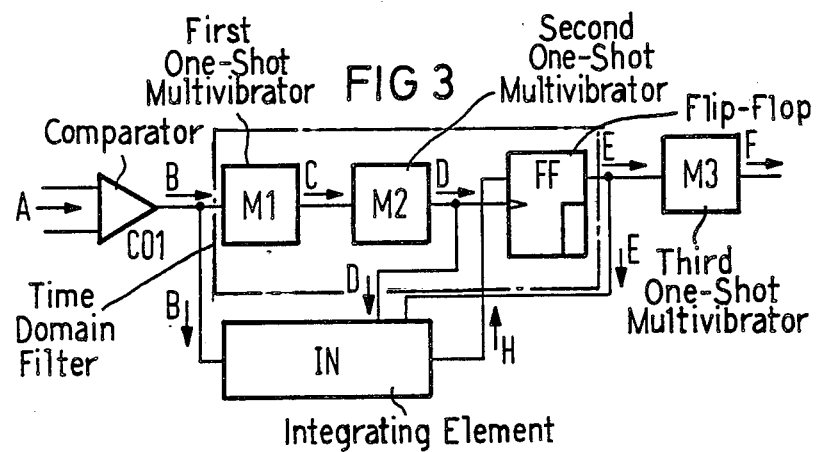
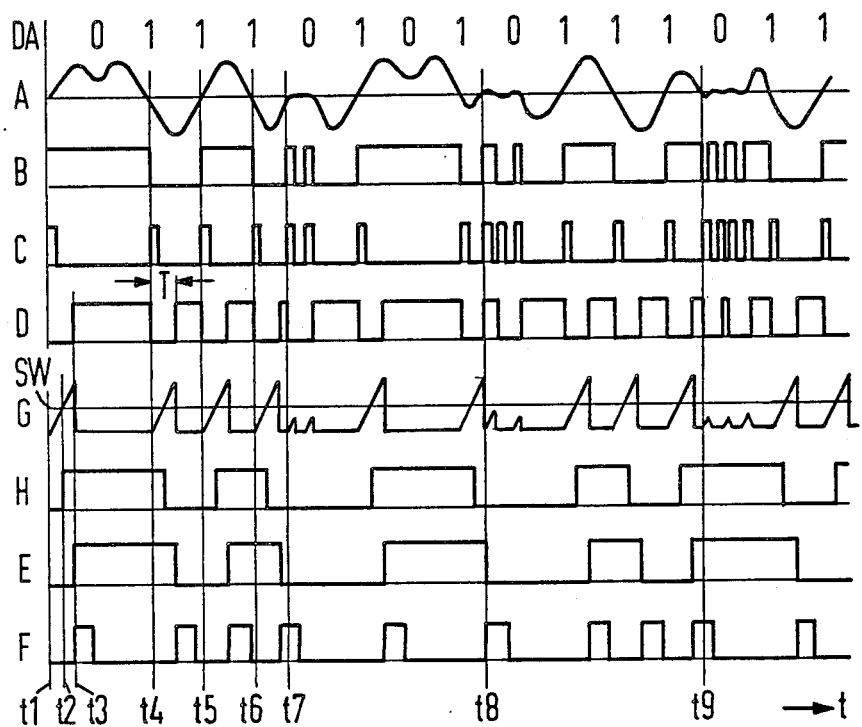

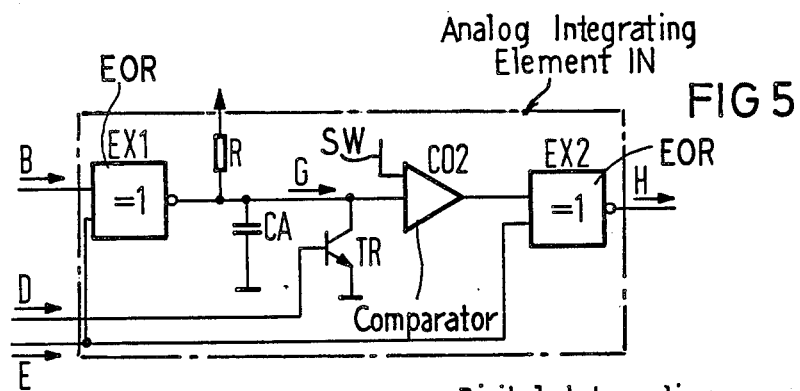
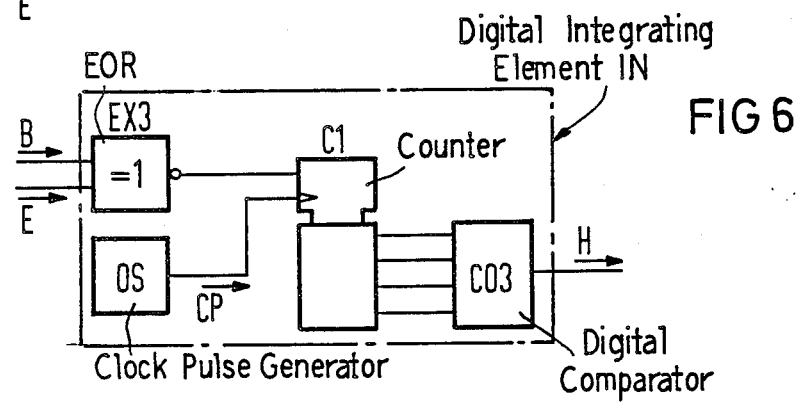
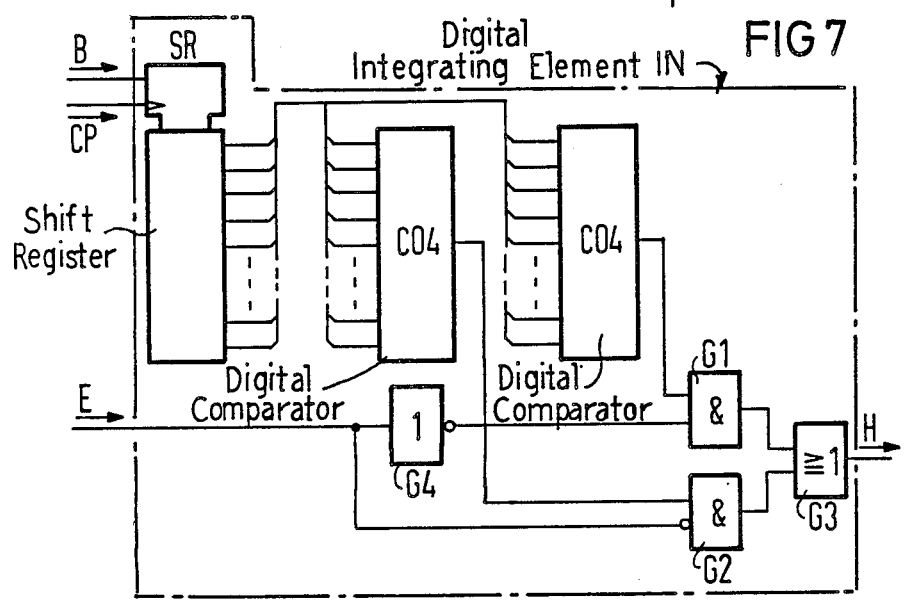

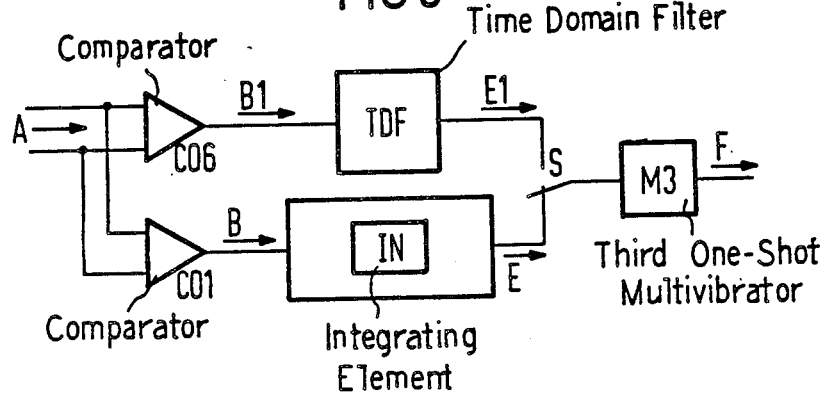
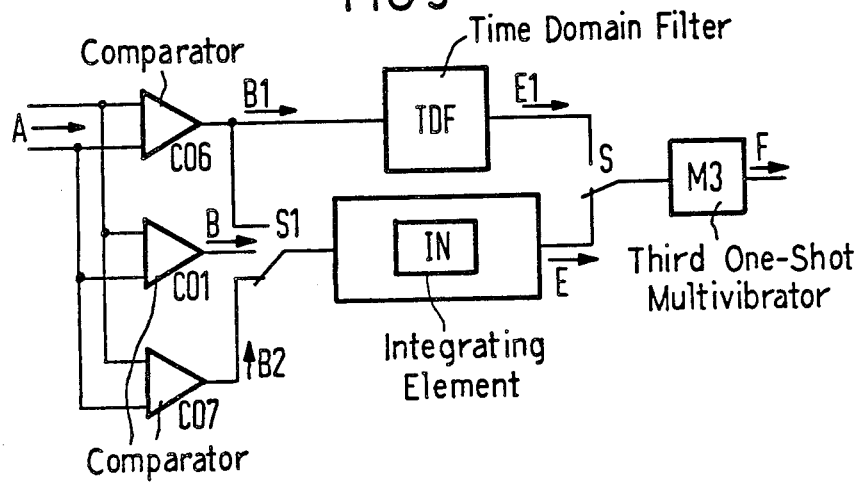

METHOD AND ARRANGEMENT FOR DISTURBANCE-PROOF RECOGNITION OF DATA CONTAINED IN DATA SIGNALS

BACKGROUND OF THE INVENTION

The invention relates to a method for disturbance-proof recognition of data contained in data signals wherein a time-domain filter is employed for sampling signals allocated to the data signals during a respectively prescribed time duration following signal edges of the data signals so as to recover data contained in the data signals. The invention also relates to an arrangement for the implementation of this method.

Time-domain filters are employed in many types of signal processing, for example in data transmission or in data storage by means of magnetic or optical recording, in order to eliminate disturbances in the data signals. In the signal processing, analog data signals are frequently converted into binary data signals for further processing. In the conversion, the time-domain filters are utilized for the elimination of the noise signals. The time-domain filters are based on the fact that specific types of disturbances that can occur in the signal processing exhibit a limited time duration. By sampling the signals in intervals that are longer than the maximum duration of these disturbances, a reduction or an elimination of these disturbances is achieved.

In a conversion of the analog data signals into binary data signals, the zero-axis crossings of the analog data signals are usually identified and the binary values of the binary data signals correspond to the polarities of the analog data signals. When, as a consequence of disturbances, additional zero-axis crossings appear, for example, due to the sag of the analog data signals between two zero-axis crossings, additional pulse-shaped, binary data signals occur which can lead to errors in the recovery of the data contained in the data signals. These additional zero-axis crossings can appear precisely after the duration for the sampling which is prescribed by the time-domain filter.

SUMMARY OF THE INVENTION

It is an object of the present invention to specify a method and an arrangement by which security against disturbance in the recognition of the data contained in the data signals is further enhanced.

Given the method of the type initially cited, this object is achieved according to the invention by integrating the data signals so as to create integrated data signals. These integrated data signals are sampled as signals allocated to the data signals.

It is possible to employ the analog data signals for the integration. Preferably, however, the analog data signals are converted into the binary data signals before the integration.

It is also possible to integrate the respective data signals during their entire duration. However, it proves expedient to integrate these only during the time duration prescribed by the time-domain filter.

In order not to have to provide a separate integrating element for every polarity or every binary value of the data signals, it is favorable when the data signals are combined with the sample or read signals before the integration in accordance with an exclusive-OR function. It also proves expedient in this case when the data signals integrated during the prescribed time duration are combined with the sample or read signals in accordance with an exclusive-OR function. The integration can occur with analog or digital components, and it is also possible to carry out a sampling of the non-integrated data signals in addition to a sampling of the integrated data signals in order to recover the data by means of the data signals or by means of the integrated data signals dependent on the disturbances that occur. In the conversion of the analog data signals into the binary data signals, in this case the binary data signals can also be respectively compared to different threshold voltages.

An advantageous arrangement for the implementation of the method wherein the data signals drive a timer element which emits a timing signal allocated to the prescribed delay time is characterized by an integrating element at which the data signals are present, which integrates these, and supplies the integrated signals to a sampling stage which samples momentary values of these integrated signals by means of the timing signals.

In case the integrating element is fashioned as an analog integrating element, this preferably contains a capacitor which is chargeable or dischargeable, dependent on the polarities or on the binary values of the data signals.

In case the integrating element is fashioned as a digital integrating element, this can contain a counter which is incremented or deincremented by high-frequency clock pulses dependent on the binary values of the data signals, and can contain a comparator which emits the integrated data signals dependent on the upward or downward crossing of a threshold.

The digital integrating element can also contain a shift register into which the data signals are stored by means of high-frequency clock pulses, and can contain comparators which emit the integrated data signals dependent on whether a prescribed polarity of first or second binary values is respectively stored in the shift register.

In addition, a known time-domain filter which samples the non-integrated data signals can be connectable in parallel. In this case, it is preferable when the analog data signals are stepped ahead via a plurality of comparators which compare the analog data signals to different threshold voltages and generate the different binary data signals.

BRIEF DESCRIPTION OF THE DRAWINGS

FIG. 1 is a block circuit diagram of an arrangement provided with a known time-domain filter;

FIG. 2 shows time diagrams of signals at various points of the known arrangement;

FIG. 3 is a block circuit diagram of an arrangement of the invention;

FIG. 4 illustrates time diagrams of signals at various points of the arrangement of the invention;

FIG. 5 is an exemplary embodiment of an analog integrating element;

FIG. 6 is a first exemplary embodiment of a digital integrating element;

FIG. 7 is a second exemplary embodiment of a digital integrating element;

FIG. 8 is a first exemplary embodiment of an arrangement wherein the known time-domain filter is additionally provided; and FIG. 9 is a second exemplary embodiment of the arrangement which contains the known time-domain filter.

DESCRIPTION OF THE PREFERRED EMBODIMENTS

In the known arrangement shown in FIG. 1, analog data signals A as shown, for example, in FIG. 2, are supplied to a comparator CO1. The analog data signals A, for example, are read output signals of a magnetic or optical data storage and are allocated to a prescribed sequence of data DA. The comparator CO1 generates binary data signals B from the analog data signals, the signal edges of these binary data signals B appearing at the zero axis crossings of the analog data signals A. For this purpose, for example, the comparator CO1 amplifies and limits the analog data signals A and compares them to a prescribed threshold voltage so that the binary data signals B assume a first binary value when a first threshold voltage is exceeded and assume a second binary value when this threshold voltage is fallen below. The binary data signals B are supplied to a time-domain filter TDF which generates largely noise de-infested or disturbance-free binary data signals E. The time-domain filter TDF contains a first one-shot multivibrator M1 which generates a pulse C at every change of the binary data signals B. The pulses C are supplied to a second one-shot multivibrator M2 which is respectively flipped into its unstable position by the pulses C, and which respectively flips back into its initial position after a prescribed time duration T. The prescribed time duration T is dimensioned such that it is greater than the greatest duration of noise pulses to be anticipated, and is smaller than the shortest duration of the rated spacings of the binary data signals B. The one-shot multivibrator M2 represents te core of the time-domain filter TDF and forms a timer element whose output signals D are timing signals by means of which the data signals B are sampled by use of a sampling stage fashioned as a flip-flop FF. For this purpose, the timing signals D are supplied to the clock input of the flip-flop FF and the momentary value of the respective data signal B is stored in the flip-flop FF with every rising signal edge of the timing signals D. The flip-flop FF emits at least partially de-infested or disturbance-free data signals E at its output. These data signals E can be supplied to a further one-shot multivibrator M3 which generates data pulses F at all signal edges of the deinfested data signals E.

As may be derived from FIG. 2, noise pulses generated between the points in time t1 and t2 which arise due to sags in the analog data signals A are eliminated by the time-domain filter TDF since the time difference between the points in time t2 and t1 is smaller than the prescribed time duration D of the timer element M2.

The noise pulses occurring between the points in time t3 and t4, however, are not recognized by the time-domain filter TDF because a second noise pulse occurs following the first noise pulse after the prescribed time duration T, and a data signal B having the binary value 1 is simulated. After the point in time t3, therefore, no change of the data pulse F allocated to the data signal B before the point in time t3 is generated, this data pulse being shown in broken lines. However, a faulty data pulse is additionally generated after the point in time t4. The same is true between the points in time t5 and t6 where two data pulses F are erroneously generated before the point in time t6 and following this point in time.

With respect to the comparator CO1, the first one-shot multivibrator M1, the timer element M2, the flip-flop FF and the one-shot multivibrator M3, the arrangement shown in FIG. 3 corresponds with the arrangement shown in FIG. 1. An integrating element IN is additionally provided, this integrating the data signals, preferably the data signals B. The integrated data signals H are sampled by means of the sampling stage fashioned as flip-flop FF. In order to integrate the data signals B only during the time duration T prescribed by the timer element M2, the timing signal D can be additionally supplied to the integrating element IN. In order not to have to employ a separate integrating element IN for every polarity or every binary value of the data signals B, this integrating element can be additionally supplied with the de-infested or disturbance-free data signal E.

Further details of the arrangement shown in FIG. 3 shall be set forth below in conjunction with the time diagrams shown in FIG. 4.

In the time diagrams shown in FIG. 4, the signals A through D correspond to the signals shown in FIG. 1. At point in time t1, the analog data signal A crosses the zero line and the binary data signal B assumes the binary value 1. With the change of the binary data signal B, the one-shot multivibrator M1 generates a pulse C which is supplied to the timer element fashioned as a one-shot multivibrator M2. The one-shot multivibrator M2 is flipped into its unstable position and generates the timing signal D with the binary value 0 during the time duration T. The integrating element IN integrates the data signals B such that, dependent on the binary values of the data signals B, a capacitor is charged or discharged or a counter is incremented or deincremented, so that signals corresponding to the signals G appear in the integrating element IN. The signals G are compared to a prescribed threshold voltage or to a threshold and, dependent on the upward or downward movement of the threshold voltage or of the threshold, integrated data signals H assume a first or second binary value.

At point in time t2, the signal G exceeds the threshold voltage SP and the integrated data signal H assumes the binary value 1. This signal H is present at the data input of the flip-flop FF and, with the rising signal edge of the timing signal D, the flip-flop FF is set at point in time t3 and the de-infested data signal A assumes the binary value 1. With the change of the data signal E, the one-shot multivibrator M3 generates a data pulse F which is allocated to the binary character 1.

Events similar to those following point in time t1 sequence at points in time t4 through t6.

At point in time t7, disturbances appear in the data signals B, since the analog signals A multiply, touch, or cross the zero line. The one-shot multivibrator M1 generates additional pulses and the timer element M2 generates timing signals D. After the delay time T, disturbances no longer occur in the data signal B at the rising signal edge of the timing signal D so that the integrated data signal H exhibits the binary value 0, and the disturbances are eliminated in the de-infested data signal E.

Noise pulses occur again at point in time t8 since the analog data signals A comprise a sag at which the zero line is likewise multiply crossed. In a fashion corresponding to point in time t7, pulses C and timing signals D are again generated. After the time duration of timing signals D, the data signal B has the binary value 1 so that the binary value 1 would be erroneously sampled if the integrating element IN were not present. Since, however, the integrated data signal H is sampled, it has a binary value zero at this point in time, and these noise pulses are no longer contained in the de-infested data signal E. The same is true following point in time t9 where the data signal B comprises noise pulses in the form of collapses. Here, too, these noise signals are no longer contained in the de-infested data signals E. Due to the employment of the integrating element IN, the data pulses F are thus unequivocably allocated to the data DA contained in the analog data signals A.

A capacitor CA is provided in the embodiment of an analog integrating element IN shown in FIG. 5, this capacitor CA being charged via a resistor R or being discharged via an exclusive-OR element EX1, dependent on the data signals B. The exclusive-OR element EX1 combines the data signals B with the de-infested data signals E so that a separate integrating element IN does not have to be provided for every polarity of the analog data signals A or for every binary value of the binary data signals B. A comparator CO2 compares the voltage at the capacitor CA to the threshold voltage SW and generates binary signals allocated to the signals G. These signals can be employed as integrated data signals H. However, it proves expedient to execute the integration only during the prescribed time duration T. For this purpose, an electronic switch fashioned as transistor TR is provided, this enabling the integration only during the time duration T and, in order to obtain the integrated digital signals H, the output signals of the comparator CO2 are combined with the de-infested data signals E in an exclusive-OR element EX2.

Given the first embodiment of an integrating element IN constructed of digital components shown in FIG. 6, the data signals B and the de-infested data signals E are likewise combined with one another by an exclusive-OR element EX3. The output signals of the exclusive-OR element EX3 are supplied with a counter C1 and indicate whether this is counted up or counted down. The counting occurs on the basis of high-frequency clock pulses CP. The counter C1 can be fashioned such that it only respectively counts up or down to a maximum counter reading. A digital comparator CO3 respectively emits the integrated data signals H whose binary values are allocated to the upward or downward movement of a prescribed counter reading. The counter C1 can likewise be supplied with the timing signals D in order to respectively enable the counting only during the time duration T. In this case, the output signals of the comparator CO3 must be combined with the de-infested data signals E by use of a further exclusive-OR element in a fashion corresponding to the operation of the arrangement shown in FIG. 5.

Given the second embodiment of an integrating element IN constructed of digital components shown in FIG. 7, the data signals B are supplied to a data input of a shift register SR and the clock pulses CP are present at the clock input. The shift register SR deposits the momentary values of the data signals B during a plurality of clock pulses CP and two digital comparators CO4 and CO5 are provided. These check whether more than a prescribed number of binary values 0 or binary values 1 are stored in the shift register SR. The prescribed number thereby corresponds to the threshold. Via AND and OR elements G1 through G3, the output signals of the comparators CO4 and CO5 are combined with the de-infested data signals E and with the de-infested data signals E inverted by means of an inverter G4, and are combined therewith in order to obtain the integrated data signals H.

Given the arrangement shown in FIG. 8, the arrangement shown in FIG. 3 is connected in parallel with the time-domain filter TDF shown in FIG. 1 and with the corresponding comparator CO6. Via a switch-over means S, the de-infested data signals E emitted by the sampling stage FF, or the de-infested data signals E1 emitted by the time-domain filter TDF, can be optionally supplied to the one-shot multivibrator M3 in order to generate the data pulses F. The comparators CO1 and CO6 can thus comprise different threshold voltages, so that, dependent on the disturbances to be respectively anticipated, either the data signals E or E1 can be employed for the recovery of the data DA contained in the data signals A.

Given the arrangement shown in FIG. 9, the known time-domain filter TDF is likewise connected in parallel. However, the integrating element IN is supplied either with the data signals B emitted by the comparator CO1, with the data signals B1 emitted by the comparator CO6, or with the data signals B2 emitted by the comparator CO7, and are supplied therewith via a switch S1. The comparators CO1, CO6, and CO7 compare the analog data signals A to various threshold voltages and, by use of the switches S and S1, either the de-infested data signals E1 generated in a known way or the de-infested data signals E1 generated by use of different data signals B, B1, or B2, can thus be employed for generating the data pulses F. In this way, the arrangement can be adapted to various demands or to various noise signals to be anticipated. The switching of the switch S1 can, for example, occur by use of a microcomputer, so that the arrangement can automatically adapt to various types of signals and disturbances.

Although various minor changes and modifications might be proposed by those skilled in the art, it will be understood that we wish to include within the claims of the patent warranted hereon all such changes and modifications as reasonably come within our contribution to the art.

We claim as our invention:

1. A method for disturbance-proof recognition of data contained in binary data signals generated from analog data signals, said binary data signals having signal edges, comprising steps of:
   generating the binary data signals from the analog data signals;
   generating timing signals which are based on the binary data signals and which define a prescribed time duration following said signal edges of the binary data signals;
   integrating said binary data signals only during said predescribed time duration so as to create integrated signals which are compared to a threshold value, and then forming integrated data signals; and
   sampling said integrated data signals by use of said timing signals as sampling signals so as to generate disturbance-free binary data signals from which the data contained in the binary data signals can be recovered.

2. A method according to claim 1 including the step of combining signals resulting from the comparison of the integrated signals to the threshold value with the disturbance-free data signals in accordance with an exclusive-OR function so as to create said integrated data signals.

3. A method according to claim 1 wherein the step of integrating occurs by use of analog components.

4. A method according to claim 1 wherein the step of integrating occurs separately for every binary value of the data signals.

5. A system for disturbance-proof recognition of data contained in binary data signals generated from analog data signals, said binary data signals having signal edges, comprising:
- means for generating the binary data signals from the analog data signals;
- timer means connected to receive said binrry data signals and for generating timing signals which are based on the binary data signals and which define a prescribed time duration following said signal edges of the binary data signals;
- integrating means connected to receive said binary data signals for integrating said binary data signals only during said prescribed time duration so as to create integrated signals, comparing the integrated signals to a threshold value, and then forming integrated data signals; and
- sampling means connected to receive said timing signals and said integrated data signals for sampling said integrated data signals by use of said timing signals as sampling signals so as to generate disturbance-free binary data signals from which the data contained in the binary data signals can be recovered.

6. A system according to claim 5 wherein the integrating means includes a capacitor and means for charging or discharging the capacitor dependent on a polarity or on binary values of the binary data signals.

7. A system according to claim 6 wherein a transistor is connected in parallel to the capacitor, and means are provided controlling said transistor for enabling integration only during said prescribed time duration.

8. A system according to claim 5 wherein said comparator means is followed by an elclusive-OR means for combining output signals of the comparator means with the disturbance-free data signals and for emitting said integrated data signals at its output.

9. A system for producing disturbance-proof recognition of data contained in data signals, comprising:
- first means for receiving the data signals and creating first binary data signals;
- second means for receiving the data signals and creating second binary data signals;
- first time-domain filter means connected to receive the first binary data signals and for outputting first disturbance-free data signals;
- a second time-domain filter means connected to receive the second binary data signals and for outputting second disturbance-free data signals;
- integrating means connected to the second time-domain filter means for receiving the second binary data signals and for outputting to said second time-domain filter means integrated data signals for use by the second time-domain filter means in creating said second disturbance-free data signals; and
- switch means connecting either the first or second disturbance-free data signals to an output.

10. A system according to claim 9 wherein the data signals are fed to the first time-domain filter means by a first comparator and the data signals are fed to the second time-domain filter means and integrating means by a second comparator.

11. A system according to claim 10 including at least a third means connected to receive the data signals and for supplying third binary data signals, and a further switch means being provided for supplying the first, second, or third binary data signals from one of the first, second, or third means to the second time-domain filter means.

12. A system according to claim 9 wherein the first and second means receive analog data signals and create the first and second binary data signals.

13. A method for disturbance-proof recognition of data contained in analog data signals, comprising steps of:
- providing a comparator means for converting the analog data signals to binary data signals having signal edges corresponding to a threshold crossing of the analog signals;
- generating timing signals which are based on the binary data signals and which define a predescribed time duration following said signal edges of the binary data signals;
- integrating said binary data signals only during said prescribed time duration by use of said timing signals so as to create integrated signals which are compared to a threshold value, and then forming integrated data signals;
- sampling said integrated data signals by use of said timing signals as sampling signals so as to generate disturbance-free binary data signals from which the data contained in the binary data signals can be recovered; and
- feeding back the disturbance-free binary data signals for use in the creation of the integrated data signals.

* * * * *